United States Patent [19]
Lawrence

[11] Patent Number: 5,999,468
[45] Date of Patent: Dec. 7, 1999

[54] METHOD AND SYSTEM FOR IDENTIFYING A MEMORY MODULE CONFIGURATION

[75] Inventor: Allen B. Lawrence, Austin, Tex.

[73] Assignee: Tanisys Technology, Inc., Austin, Tex.

[21] Appl. No.: 09/193,804

[22] Filed: Nov. 17, 1998

[51] Int. Cl.⁶ .................................................... G11C 7/00
[52] U.S. Cl. ............................................................ 365/201
[58] Field of Search .............................. 365/201, 230.03, 365/63, 189.07

[56] References Cited

U.S. PATENT DOCUMENTS 5,644,530   7/1997   Gaultier ............................. 365/201 X
5,883,844   3/1999   So .......................................... 365/201

*Primary Examiner*—Huan Hoang
*Attorney, Agent, or Firm*—Baker & Botts, L.L.P.

[57] ABSTRACT

A method and system for identifying the configuration of a memory module from a list of memory module parts uses contact test results on the memory module to determine data, control and address lines connected to the module. The memory module data, control and address line configurations as determined by the contact test are compared with data, control and address line configuration information from a list of potential memory parts. Non-matching memory parts from the list are eliminated from further testing, resulting in a reduced number of read and write cycles used by the tester to identify parts located on the memory module. The tester counts the number of data lines connected to the memory module to determine the width of the memory parts. The tester then performs a read and write operation to determine the number of memory banks located on the memory module and the control line configuration of the memory module. The tester then runs address tests for matching parts of the parts list to determine the depth of the parts loaded on the module, allowing identification of the parts loaded on the module, and resulting in identification of the memory module's configuration.

21 Claims, 3 Drawing Sheets

METHOD AND SYSTEM FOR IDENTIFYING A MEMORY MODULE CONFIGURATION

CROSS REFERENCE TO RELATED APPLICATIONS

This application is related to U.S. patent application Ser. No. 09/032,958, entitled "Contact Test Method and System" by Lawrence, and assigned to Tanisys Technology, Inc.

TECHNICAL FIELD OF THE INVENTION

This invention relates in general to the field of testing electronic devices, and more particularly to an improved method and system for identifying a memory module configuration.

BACKGROUND OF THE INVENTION

A substantial industry has evolved for packaging integrated circuit (IC) memory devices into subassemblies, known as memory modules, for use in computing devices. Personal computer manufacturers tend to order assembled and tested memory modules, as opposed to individual memory integrated circuits, for the assembly of personal computers. In this way, computer manufacturers avoid the labor expenses and training needed to assemble and test memory integrated circuits on a memory module before the manufacturer integrates the module into a computing device.

To enhance the ease of assembly and integration of memory modules in computing devices, standards have been developed for interfacing memory modules with computing devices. For instance, a typical memory module has defined interface lines for transferring control information, address information and data information between memory integrated circuits located on the module and a computing device supported by the module. As an example, a typical memory module may have 64 or 72 data lines for supporting data transfer to and from a bank of eight or more memory integrated circuits accessed in parallel, and additional lines for communicating control and address information with the memory integrated circuits. Each integrated circuit has pins that connect the integrated circuit with module lines for communicating control, address, and data information.

The configuration of a memory module, meaning the number, type, arrangement and interfacing of integrated circuits on the module, is not readily apparent through a visual inspection of the integrated circuits loaded on the module. For instance, a given arrangement of integrated circuits may not use all of the available control, address and data lines of a memory module. Further, different types of integrated circuits can use similar module lines but communicate different types of data over these lines. Thus, the configuration of a memory module depends upon end user requirements and the parts used to assemble the memory module, including the type of memory integrated circuits loaded on the module.

Before an end user, such as a computer manufacturer, will generally accept a memory module for assembly into a computing device, the end user usually requires testing of the memory module to ensure compliance with its requirements. Testing of memory modules is accomplished by writing and reading a variety of data to the module to ensure that the module, and the integrated circuits on the module, performs accurately. Such testing is performed based upon the particular configuration of the module being tested. Thus, the first step in testing a memory module is identifying the configuration of the module so that a pre-determined test sequence can be performed on the module.

Conventional memory module testing has relied upon manual entry of test parameters determined according to a visual inspection of the memory module and the parts loaded on the memory module. However, manual entry of test parameters is a time consuming and tedious task that is prone to human error. In particular, manual entry of test parameters is difficult and time consuming when testing a large variety of memory module configurations.

To overcome difficulties associated with manual entry of test parameters, Tanisys Technology, Inc. has led the industry in developing automated systems for identifying the configuration of a memory module. U.S. Pat. No. 5,812,472, entitled "Nested Loop Method of Identifying Synchronous Memories", by Lawrence, et al., and assigned to Tanisys Technology, Inc., which is incorporated herein by reference, discloses a nested loop method for identifying the configuration of a memory module. The nested loop method tests a sequence of bit patterns retrieved from tables representative of memory parts to determine the configuration of a memory module under test. Essentially, the nested loop method identifies a memory module configuration by performing read and write cycles to the memory module under test until the identification of parts on the memory module is accomplished.

Although the automatic identification method and system developed by Tanisys Technology, Inc. provides a significant advance for automatic identification of a memory module configuration to greatly enhance memory module testing, a number of difficulties remain with the nested loop identification method. One difficulty is the time generally used to perform read and write cycles in sequence until identification of the memory module configuration is accomplished. In summary, the nested loop method runs a sequential series of read and write cycles and checks the results of the read and write cycles against a table to identify parts on the memory module. Depending upon the number of parts and the number of cycles run until the parts are identified, the nested loop method can take up to one minute to identify a memory module configuration.

Another difficulty associated with identifying a memory module configuration occurs when the memory module has a defect. For example, during assembly of a memory module, a bad wire or pin connection can result in failure of signal transfers to and from one or more parts loaded on the memory module. If, for instance, a memory bank having nine address lines has a poor pin or wire connection for one address line, then a tester may identify the memory module configuration as a single memory bank having eight address lines. Based upon such an erroneous identification, the tester may test the system as an eight address line configuration, resulting in passing of the test and shipment of a faulty memory module.

Safety is another concern associated with memory testing. Typically, memory module configuration identification is accomplished before testing is performed. However, in order to identify any memory module configuration automatically, power is generally applied to the memory module to support a series of read and write operations. If the memory module has a fault or is erroneously loaded in the tester, powering up of the memory module can result in damage to the module as well as the tester. For instance, a tester operator might load a memory module into a tester backwards. In such a case, application of power from the tester to the module for identifying the module configuration can result in damage to an otherwise operable memory module.

SUMMARY OF THE INVENTION

Therefore, a need as arisen for a method and system for identifying a memory module configuration automatically in a reduced period of time.

A further need has arisen for a method and system which accurately identifies a memory module configuration in the face of defects associated with the memory module configuration.

A further need has arisen for a method and system for identifying a memory module configuration which enhances the safety of the identification and testing process.

In accordance with the present invention, a method and system for identifying a memory module configuration is provided that substantially eliminates or reduces disadvantages and problems associated with previously developed methods and systems for identifying a memory module configuration. A contact test is performed on the memory module to determine data, control and address lines that are connected to the module. The configuration of the connected memory module data, control and address lines is compared to a list of memory module parts, the list including data, control and address line information for the parts. The comparison of the contact test results and the parts list information allows identification of parts loaded on the memory module, and thus identification of the configuration of the memory module.

More specifically, a contact test is performed on the memory module by setting all memory module pins to zero volts, forcing a forward biasing current through diodes, and measuring the resulting pin voltage to determine whether the pin is connected. Once the memory module's connected pins are determined, they are compared against standardized data, control and address line configurations to determine the data, control and address line pins connected to the module. The data, control and address line configurations of the module are then compared against data, control and address line configurations of possible memory module parts stored in a memory module parts list. If more than one memory module part matches the data, control and address line configurations resulting from the contact test, then additional test runs are accomplished to identify the memory module parts loaded on the memory module.

To identify the memory parts loaded on the memory module, a processor, such as an embedded processor on a tester or an external processor in communication with a tester, uses the data, control and address line information derived from the contact test to determine the identity of the configuration of the memory module. First, the width of the module is determined by counting the data line pins connected to the module. Next, the number of memory banks and the control line configuration is determined by performing a single memory bank control configuration test to determine if the memory module has a single memory bank or plural memory banks. If the single memory bank control configuration test passes, then the module has a single memory bank configuration and the control line configuration is defined. If the single memory bank control configuration test fails, then the tester enables each control line configuration to attempt to read and write the memory module. The memory module control line configuration is defined by determining the best results for reading and writing to each memory bank. Next, the tester compares the address line configuration determined by the contact test with the address line configuration of memory parts from a memory parts list and eliminates non-matching parts from further testing. The remaining parts on the memory parts list are then sorted from greatest to least depth and an address test is run for each remaining part configuration until a part passes, resulting in identification of the part. Address test runs are accomplished for each memory bank, resulting in identification of the memory module configuration by identifying the parts loaded on the module. Once the parts are identified, the memory module can be tested at different speeds, such as 66 and 100 MHZ, to determine the speed of the module, and at different temperatures to determine the robustness of the parts' temperature ratings.

Although the present invention is described above in terms of identification of a memory module configuration, identification of a wide variety of integrated circuit chips is possible. For instance, input/output lines of conventional microcontrollers are typically protected by a diode, allowing the performance of a contact test to determine what input/output lines are connected for identification of the microcontroller. Thus, the present invention supports identification of any diode protected integrated circuit.

The present invention provides a number of important technical advantages. One important technical advantage is that a memory module configuration is identified in a rapid manner by using contact test results. Determination of data, control and address line configurations with the contact test allows the tester to limit the possible number of parts loaded on the memory module. By limiting the number of possible memory parts, the contact test determination reduces the number of read and write cycles needed to identify a memory module configuration. This reduction in test cycles reduces test time, in some instances, as great as ten-fold, and can reduce the time needed for automatic identification of a memory module configuration to a matter of seconds.

Another important technical advantage of the present invention is the increased accuracy for identifying a memory module configuration provided by using contact test results. Once the memory module has passed the contact test, this reduces the likelihood that an inaccurate identification will occur due to wire and pin defects in the memory module. The contact test provides readily accessible information for identifying data, control and address lines of memory parts that are connected to the memory module, enabling quick, easy and accurate determination of the data, control and address line configurations of the parts on the module.

Another important technical advantage of the present invention is the reduced risk of damage occurring to the tester or memory module due to incompatibility of the memory module with test signals. If a defect in the memory module is determined, such as a short or an unconnected pin, the identification process can be halted. Thus, the contact test results can limit the risk of damage to the memory module due to part defects or human error. For example, common operator errors such as inserting a memory module in the tester backwards, can be corrected before test signals are provided to the memory module.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein.

DETAILED DESCRIPTION OF THE INVENTION

Preferred embodiments of the present invention are illustrated in the FIGURES, like numeral being used to refer to like and corresponding parts of the various drawings.

Typically, a memory module is not subjected to testing until the configuration of the memory module is identified, including the type and arrangement of memory integrated circuits loaded on the module. More particularly, accurate testing generally is predicated upon accurate identification of the number of memory banks on the module, the number of integrated circuits in each memory bank, and the width and depth of memory storage available in the memory integrated circuits. Once the configuration of a memory module is known, test signals can be provided in accordance with the configuration to test the accuracy of the module for storing and retrieving data. In conventional systems, testing of a module before identification of the module's configuration will fail to provide useful test results since each memory module configuration stores and retrieves different forms of data using different control and address signals. Further, testing an unknown configuration can potentially result in damage to the module and the testing system.

The present invention provides an important innovation by performing a contact test before identification of the configuration of the memory module. The low current and voltage generated in a contact test make the contact test viable before identification of the module's configuration with little risk of damage to the module or the tester. The contact test confirms that a module under test does not have basic faults, such as shorts and gaps, and also provides basic information regarding the pins and lines connected on the module. Once a contact test has determined which pins and lines are connected on a module, this information is compared against standard configuration information to identify the active data, control and address lines of the module. The identification of active data, control and address lines allows the tester to identify the parts on the module from a list of potential parts by eliminating non-matching parts from the list and testing for the remaining parts on the list until the parts on the module are identified. Although the present invention is described in terms of identification of a memory module configuration, the identification method can be applied to the identification of other integrated circuits having protection diodes that will support a contact test. For instance, a contact test could be used to identify a microcontroller based upon the configuration of the microcontroller's diode protected input/output pins.

Figure 1:
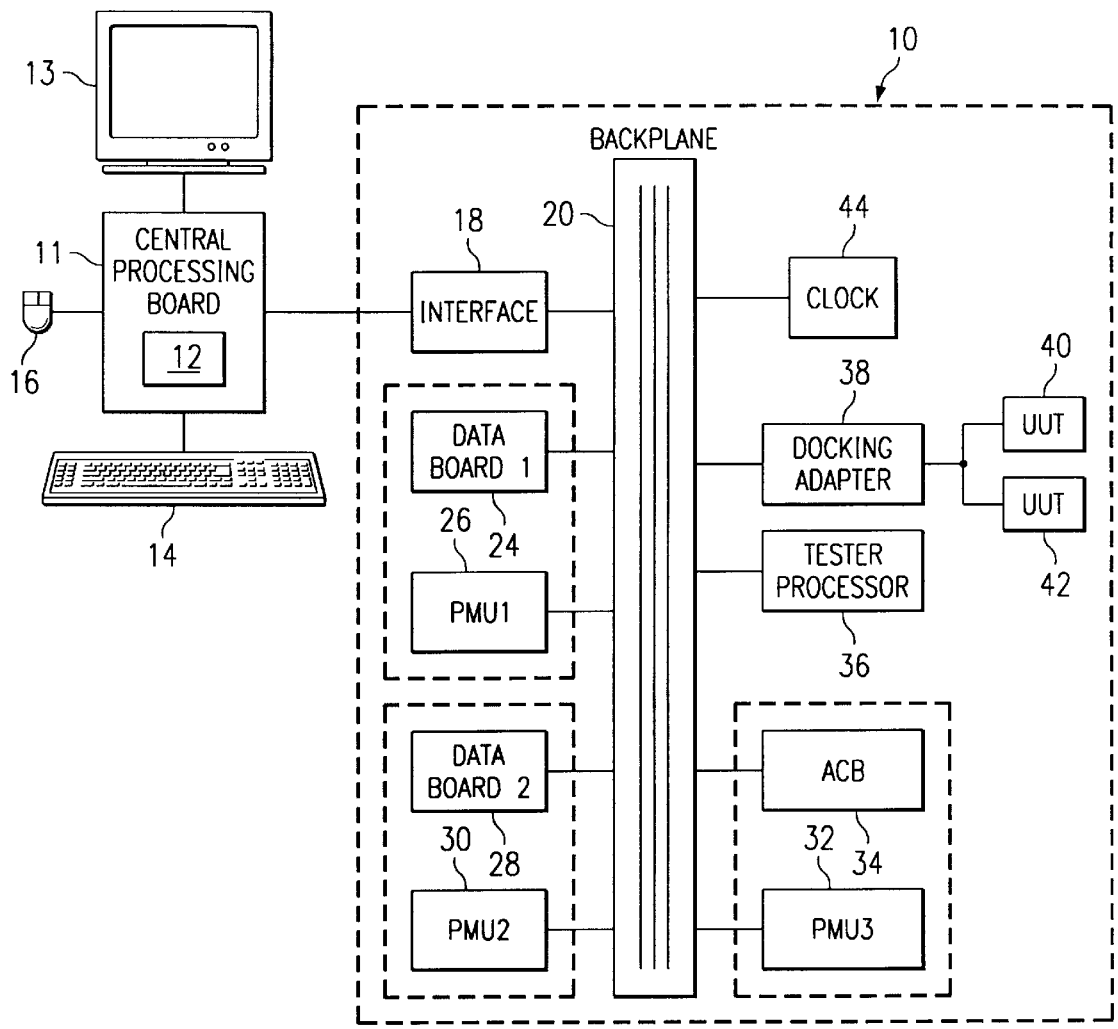
FIG. 1 depicts a block diagram of a memory module tester.

Referring now to FIG. 1, a block diagram of a memory module tester 10 is depicted. A central processing board 11 supports a main test application program 12 and interfaces with a user through display 13, keyboard 14 and mouse 16. Central processing board 11 communicates through interface 18 to back plane 20 of tester 10. Back plane 20 provides communication buses for supporting testing of memory modules, such as a data bus, address bus and control bus.

A data board 24 having an associated parametric measurement unit (PMU) 26 and a data board 28 having an associated PMU 30 interface with back plane 20. An address control board 34 and its associated PMU 32 also interface with back plane 20 PMU boards 26, 30 and 32, in cooperation with their associated data board 24 and 28 and ACE board 34, provide measurements of signals in support of memory module testing, including current leakage measurements, output signal voltage measurements and other analog measurements. Tester 10 also supports testing of parts at various frequencies and temperatures to determine the robustness of the parts' speed and temperature ratings.

A tester processor board 36 interfaces with back plane 20 to provide control of synchronized communication for testing memory modules. Tester processor board 36 includes a processor and local memory for accepting and storing commands and data from central processing board 11. Tester processor board 36 receives command packets from central processing board 11 and sends status and data back to central processing board 11 for display to a user. Tester processor 36 controls the operation of data boards 24 and 28 and ACB 34. Thus, in summary, tester processor 36 supports algorithms for identification of a memory module configuration based on commands received from central processing board 11. In an alternative embodiment, some or all of the functions of tester processor 36 can be performed by central processing board 12 in communication with back plane 20 through interface 18. Thus, the identification algorithms can reside inside tester 10, such as by use of the internal tester processor 36, or can reside in a processor external to tester 10, such as central processor board 11.

A docking adapter 38 interfaces with back plane 20 and accepts one or more memory modules for testing. A first memory module unit under test (UUT) 40 and a second memory module unit under test 42 interface with docking adapter 38. Docking adapter 38 is an interchangeable part to allow testing of a wide variety of memory modules. An adapter I.D. code is stored in an EEPROM affixed to adapter 38 for specifying the type of memory module package that is accepted by adapter 38. For instance, the EEPROM can identify a memory module as a DIMM 168 pin memory module or an SODIMM 144 pin memory module.

Figure 2:
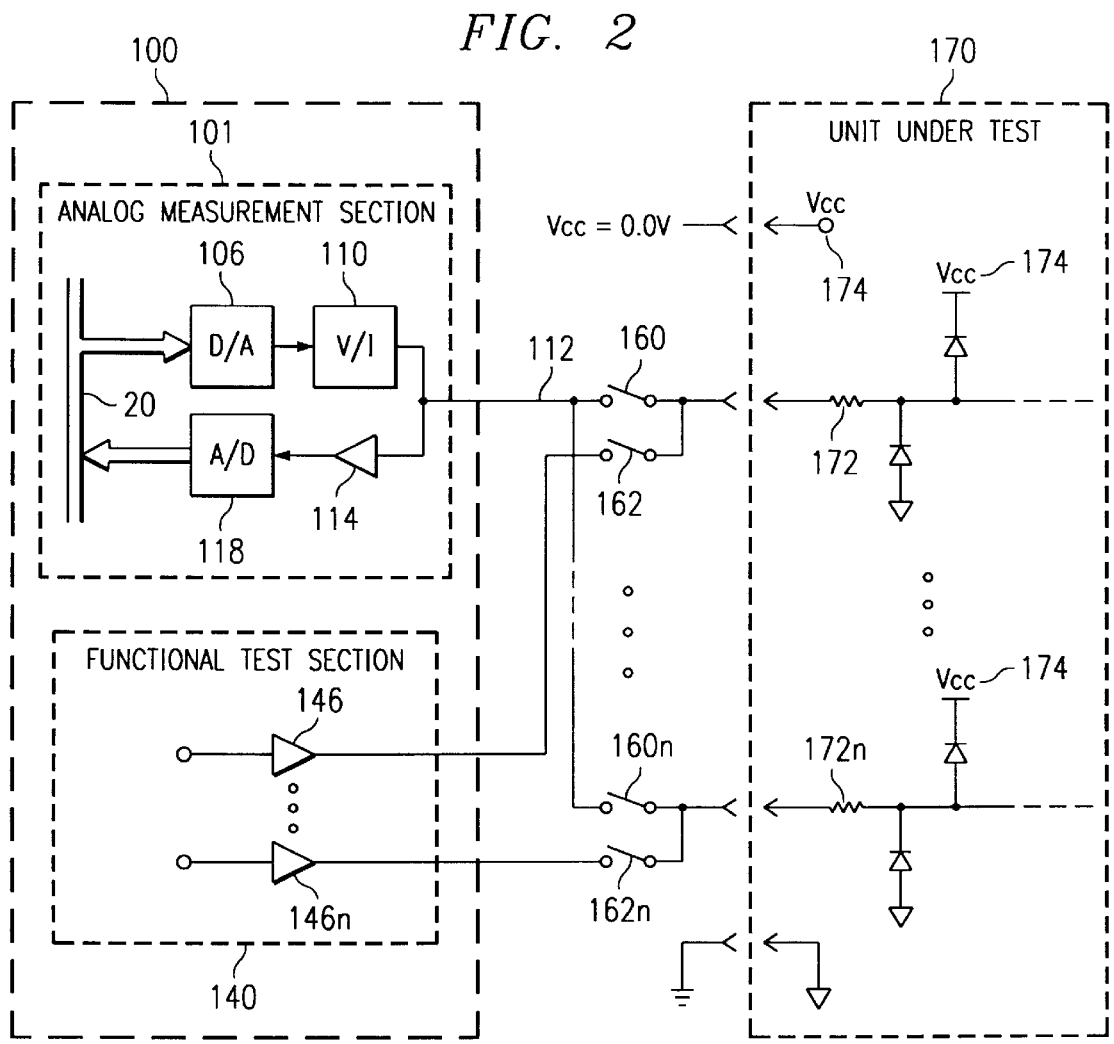
FIG. 2 depicts an electronic schematic diagram of a contact test measurement unit.

Referring now to FIG. 2, an electronic schematic diagram depicts a parametric measuring unit 100 having an analog measurement section 101 and a functional test section 140 for performing a contact test with tester 10. A full description of contact test PMU 100 and its operation is found in U.S. patent application Ser. No. 09/032,958 entitled "Contact Test Method and System for Memory Testers", by Lawrence, assigned to Tanisys Technology, Inc., which is incorporated herein by reference. In summary, a digital analog converter 106 accepts signals from tester processor 36 through back plane bus 20 and provides an output to a voltage to current converter 110. Current from converter 110 is applied by line 112 to switch 160 and to buffer amplifier 114. The output of buffer amplifier 114 is applied to analog digital converter 118 for transmission to tester processor 36 through back plane 20. A second switch 162 accepts an input of a logic 0 from a digital buffer 146, which is held to an analog ground. Switch 160 is electrically connected to switch 162 and a diode protected input/output pin 172 of a module unit under test 170.

In operation, the $V_{cc}$ source 174 for unit under test 170 is set to 0 volts, and the pole of grounding switch 162 is closed to allow digital buffer 146 to force all pins 172 to ground. A voltage is then applied by converters 106 and 110, switch 162 is opened, and switch 160 is closed to cause a forward biasing current to flow through pin 172. The voltage output of converter 118 is then measured to determine whether pin 172 is connected, open or has a short. The results of the contact test are available to tester processor 36 for comparison against standard memory module configurations to determine the connected data, control and address lines of the module under test.

Figure 3:
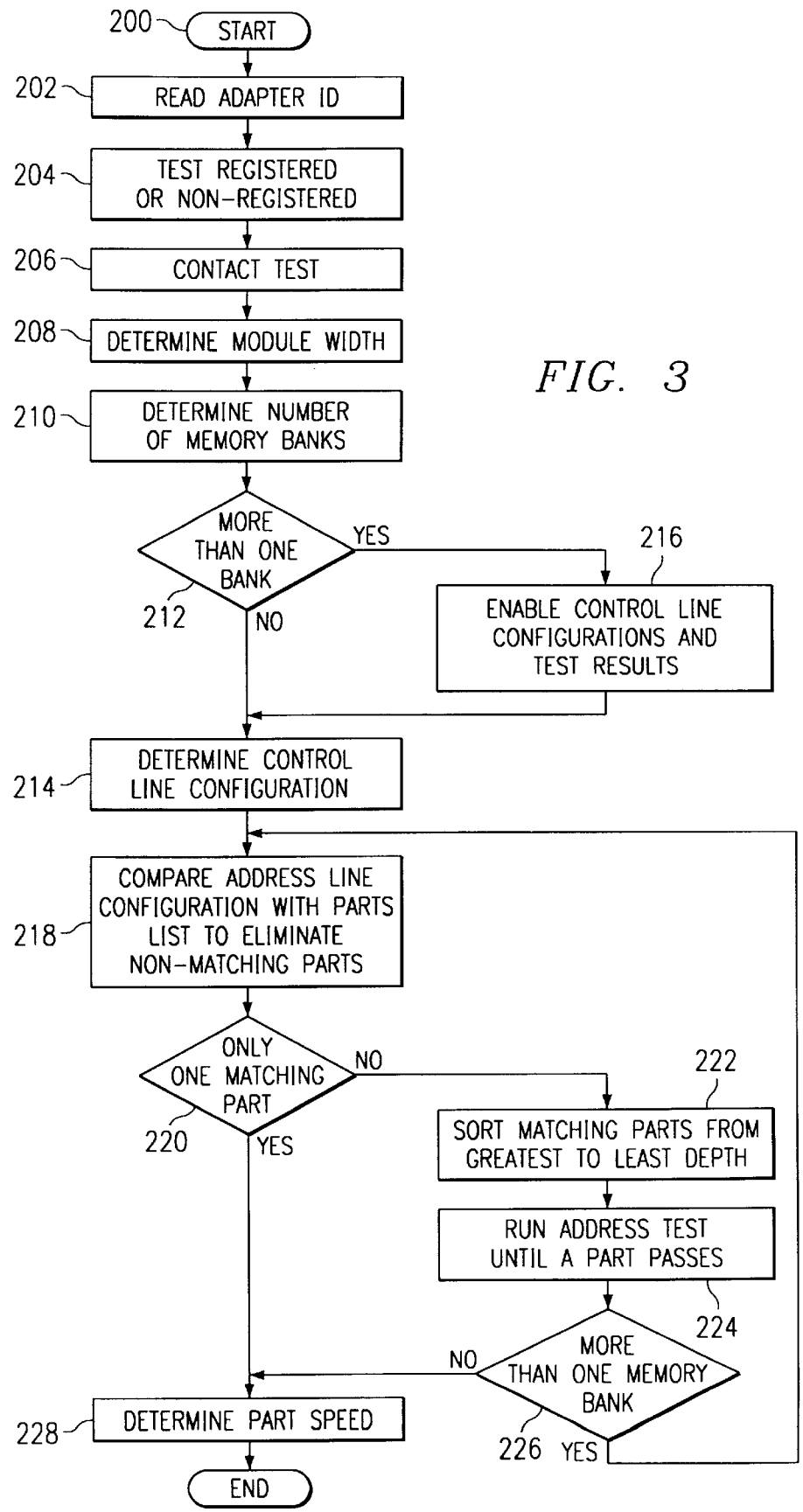
FIG. 3 depicts a flow diagram of steps for identifying the configuration of a memory module.

Referring now to FIG. 3, a flow diagram is depicted for describing the steps of using contact test results to identify a memory module configuration. At step 200, tester 10 is initialized and prepared for testing a memory module. Control program 12 commands central processing board 11 to provide a memory parts list to tester processor 36. The memory parts list includes a table of possible memory integrated circuits that could be loaded on a memory module under test. For instance, possible memory integrated circuits include different types of DRAM, SDRAM and SGRAM integrated circuits, with the memory parts list including each integrated circuits' associated data, control and address line configurations.

The memory parts list provided to tester 10 can be developed to focus on a knowledge base for predetermined memory module configurations. For instance, in some unusual module configurations, the tester may provide an incorrect module configuration identification or may provide several alternative configurations as possible identifications. As an example, a module may be assembled with a non-standard use of a line. If, for instance, an address line is used for non-standard data, the contact test could indicate that the module has an additional memory integrated circuit associated with the address line. One alternative in such a situation is to allow the user to interact with the memory parts list to narrow the scope of the list or to add configuration information for a particular module or set of modules to the list for a particular test run. Another alternative is to present the user with a set of choices for memory module identification after a test run, and allow the user to confirm one of the set as the proper choice. For instance, the user could direct the tester to eliminate the non-standard address line from consideration and retry the identification of the module.

At step 202 the identification of adapter 38 is read from the EEPROM associated with adapter 38. The adapter identification provides voltages and control line configurations per bank for memory modules that interface with the adapter. The adapter identification will, for instance, specify whether the memory module under test supports SDRAM or DRAM integrated circuits. At step 204 tester processor 36 also determines whether the memory module has a registered or non-registered timing set, and accepts a download of the appropriate timing set. A module can be checked to determine whether or not it is registered by checking to see if the register enable pin is connected. Timing sets are sequences of high-speed operations that are loaded and run inside address control board 34 to set predetermined memory modes in a module or to perform read and write tests in conjunction with the data boards.

At step 206, a contact test is performed on the memory module under test. Tester processor 36 receives the voltage response from contact test PMU 100, enabling tester processor 36 to determine the lines of the memory module that are connected.

At step 208, tester processor 36 determines the width of the memory module under test by counting the data lines that the contact test determines are connected. For instance, a memory module having a 64 bit wide bus would have 64 data lines connected, whereas a memory module having a 72 bit wide bus would have 72 data lines connected. Advantageously, the width of the module is determined without a need to perform memory read and write cycles.

At step 210, tester processor 36 determines the number of memory banks that are loaded on the memory module under test. At step 212 tester processor 36 compares the control lines, as determined by the contact test, against the control line configuration for a single memory bank module. Typically, each addition of a memory bank on a module uses an additional control line for the module. If tester processor 36 determines that only a single memory bank control line is connected, then at step 214, the control line configuration for the memory module under test is determined. If, however, the contact test indicates that more than one memory bank is loaded on the memory module under test, then, at step 216, tester processor 36 enables each control line configuration to determine the control line configuration for each memory module bank. Tester processor 36 directs a memory read and write cycle for each control line configuration to associate control lines with an appropriate memory module bank.

At step 218, tester processor 36 determines the address line configuration for the memory module under test. Tester processor 36 uses the contact test results to determine the number of address lines connected to the module under test. The number of address lines for the memory module under test is then compared to the number of address lines associated with parts from the memory parts list. Tester processor 36 then eliminates from further testing parts on the parts list that have address line configurations that do not match the address line configuration of the memory module under test, as determined by the contact test By eliminating non-matching parts from further consideration as potential parts loaded on the memory module, tester processor 36 reduces the number of memory cycles needed to identify the parts loaded on the memory module under test.

Although the contact test provides information for matching parts based on the number of address lines connected, this information is not adequate to determine the depth of the parts located on the memory module. Address lines are multiplexed to enable a greater number of addresses on a given memory integrated circuit. For instance, an integrated circuit having 11 address lines multiplexed eight times can store data at $2^{19}$ addresses; whereas an integrated circuit having 11 address lines multiplexed nine times can store data at $2^{20}$ addresses.

At step 220, if the parts list only has one part that matches the number of address lines determined by the contact test, then the part can be identified based on this information. If more than one part from the parts list has the number of address lines determined by the contact test, then a series of address tests are run to determine the depth of the part loaded on the memory module.

At step 222, tester processor 36 sorts the parts having matching address line configurations from greatest to least depth. At step 224, tester processor 36 directs address tests on the matching parts from greatest to least depth until a part passes the address test. Once a part passes, that part is identified as the part loaded on the memory module. If the number of parts is large, other search algorithms, rather than a linear search method can be used to reduce test time. A binary search algorithm is one potential alternative.

At step 226, tester processor 36 uses the control line configuration information to determine whether another memory bank exists on the memory module that is in need of identification. If additional memory banks need identification, tester processor 36 returns to step 218 until all memory bank parts on the memory module are identified. Typically, memory modules with plural memory banks are configured with the same type of memory integrated circuits for each memory bank. Thus, the tester can reduce the time needed to identify parts on subsequent memory banks by using knowledge obtained by the first memory bank identification, such as the type of parts loaded on the first memory module bank. Once all parts are identified, tester processor 36 proceeds to step 228 and determines the part speed by running memory cycles at 66 or 100 MHZ.

Once the configuration of a memory module is identified, the identification of the module allows the tester to determine whether the module, or parts on the module, have faults. Automatic identification of a memory module configuration, whether the module supports DRAM, SDRAM, SGRAM or other types of memory integrated circuits, enhances testing of the module by reducing the work load of an operator of a test system. The tester process simply proceeds with testing of the identified memory module configuration, reducing or eliminating the need for inputs from an operator of the tester.

Although the present invention has been described in detail, it should be understood that various changes, substitutions and alterations can be made hereto without departing from the spirit and scope of the invention as defined by the appended claims.

What is claimed is:

1. A method for identifying the configuration of a memory module from a list of memory module parts, the method comprising the steps of:

performing a contact test on the memory module to determine the data, control and address lines connected to the module;

identifying parts from the list having an address line configuration matching the address lines of the module as determined by the contact test; and running an address test on the module for the identified parts to identify the part on the module.

2. The method according the claim 1 wherein said running an address test step further comprises:

sorting the identified parts according to depth;

running address tests for the identified parts from greatest to least depth until a part passes the address test; and identifying the part that passed the address test as the part on the module.

3. The method according the claim 1 further comprising the step of determining the number of memory banks on the module.

4. The method according the claim 3 wherein said determining the number of memory banks step comprises determining whether the module has a single memory bank by testing the control lines determined by the contact test with a single memory bank control configuration.

5. The method according to claim 4 further comprising the step of determining the control line configuration for plural memory banks when the single memory bank control configuration test determines that the module has plural memory banks by enabling each control line configuration and determining which bank reads and writes for each control line configuration.

6. The method according to claim 5 further comprising the step of performing an address test for each memory bank to identify the parts of each memory bank.

7. The method according the claim 1 wherein said running an address test step is performed at approximately 66 MHZ.

8. The method according the claim 7 further comprising the step of running the address test for the identified part at 100 MHZ to determine the part's speed.

9. The method according to claim 1 wherein the parts of the list comprise DRAM integrated circuits.

10. The method according to claim 1 wherein the parts of the list comprise SDRAM integrated circuits.

11. The method according to claim 1 wherein the parts of the list comprise SGRAM integrated circuits.

12. A method for identifying the configuration of parts on a memory module, the method comprising the steps of:

compiling a list of memory module parts, the list having data, control and address configuration information for the parts;

performing a contact test on the memory module to determine data, control and address lines connected to the module; and comparing the data, control and address configuration information of the list with the data, control and address line determination of the contact test to identify a part on the module.

13. The method according to claim 12 wherein said performing a contact test step comprises:

providing a biasing current to the memory module lines; and measuring the voltage of the lines to determine if the lines are connected to parts loaded on the module.

14. The method according to claim 12 wherein said comparing step further comprises:

counting the number of data lines connected on the module to determine the width of the parts; and comparing the control line configuration against a single memory bank control line configuration to determine the number of memory banks loaded on the module.

15. The method according to claim 14 wherein said comparing step further comprises:

comparing the address lines connected to the module with address line configurations of parts on the parts list; and running address tests on the module for matching parts of the parts list to identify the part on the module.

16. The method according to claim 14 wherein said comparing step further comprises determining control lines associated with each memory bank by enabling each control line configuration to associate each configuration with a memory bank.

17. The method according to claim 16 wherein said comparing and said running address tests steps are performed for each memory bank.

18. The method according to claim 12 further comprising the step of determining whether the memory module is a registered module.

19. A system for identifying the configuration of a memory module having parts, the module communicating data, control and address information with the parts over data, control and address lines, the system comprising:

an adapter for accepting a memory module for testing;

a measurement unit interfaced with the adapter, the measurement unit for providing signals to perform a contact test on the memory module; and a tester processor interfaced with the measurement unit, the processor for receiving contact test results to determine the data, control and address lines of the parts loaded on the module.

20. The system according to claim 19 wherein the processor determines the width of the part by counting the data lines connected to the parts.

21. The system according to claim 19 further comprising memory associated with the processor, the memory storing a list of parts and data, control and address configuration information associated with the parts;

wherein the processor identifies the parts loaded on the module by directing read and writes cycles to the module for parts having address configurations matching the address lines of the module.

* * * * *